(12) United States Patent
Kandlikar et al.

(10) Patent No.: US 11,092,391 B2
(45) Date of Patent: Aug. 17, 2021

(54) ENHANCED BOILING WITH SELECTIVE PLACEMENT OF NUCLEATION SITES

(71) Applicants: Satish G. Kandlikar, Rochester, NY (US); Chinmay Patil, Rochester, NY (US)

(72) Inventors: Satish G. Kandlikar, Rochester, NY (US); Chinmay Patil, Rochester, NY (US)

(73) Assignee: Rochester Institute of Technology, Rochester, NY (US)

( * ) Notice: Subject to any disclaimer, the term of this patent is extended or adjusted under 35 U.S.C. 154(b) by 0 days.

(21) Appl. No.: 15/305,020

(22) PCT Filed: May 18, 2015

(86) PCT No.: PCT/US2015/026377
§ 371 (c)(1),
(2) Date: Oct. 18, 2016

(87) PCT Pub. No.: WO2015/175147
PCT Pub. Date: Nov. 19, 2015

(65) Prior Publication Data
US 2017/0176114 A1    Jun. 22, 2017

Related U.S. Application Data

(60) Provisional application No. 61/981,268, filed on Apr. 18, 2014.

(51) Int. Cl.
*F28F 13/18* (2006.01)
*H01L 23/427* (2006.01)
*H01L 23/44* (2006.01)

(52) U.S. Cl.
CPC .......... *F28F 13/187* (2013.01); *H01L 23/427* (2013.01); *H01L 23/44* (2013.01); *H01L 2924/0002* (2013.01)

(58) Field of Classification Search
CPC ...... F28F 13/182; F28F 13/185; F28F 13/187; B01D 17/0205
(Continued)

(56) References Cited

U.S. PATENT DOCUMENTS

| | | | | |
|---|---|---|---|---|
| 4,216,826 A | * | 8/1980 | Fujikake | F28F 13/187 165/133 |
| 5,259,448 A | * | 11/1993 | Masukawa | F28F 13/187 165/133 |

(Continued)

FOREIGN PATENT DOCUMENTS

| | | |
|---|---|---|
| CN | 102683305 | 12/2014 |
| WO | WO2013177547 A1 | 11/2013 |

(Continued)

OTHER PUBLICATIONS

International Search Report and Written Opinion of corresponding International Application No. PCT/US2015/026377 dated Nov. 4, 2015.

(Continued)

*Primary Examiner* — Eric S Ruppert
*Assistant Examiner* — Hans R Weiland
(74) *Attorney, Agent, or Firm* — Bond, Schoeneck & King, PLLC; Joseph Noto

(57) ABSTRACT

A heat transfer system includes a substrate having a heat exchange region including a surface having an enhancement region including alternating regions of selectively placed plurality of nucleation sites and regions lacking selectively placed nucleation sites, such that bubble formation and departure during boiling of a liquid in contact with the enhancement region induces liquid motion over the surface of the regions lacking selectively placed nucleation sites (Continued)

sufficient to enhance both critical heat flux and heat transfer coefficient at the critical heat flux in the enhancement region of the system.

8 Claims, 15 Drawing Sheets

(58) Field of Classification Search
USPC .......................................................... 165/911
See application file for complete search history.

(56) References Cited

U.S. PATENT DOCUMENTS

| | | | |
|---|---|---|---|
| 5,415,225 A | 5/1995 | Randlett et al. | |
| 6,176,301 B1* | 1/2001 | Bennett | F28F 1/40 165/133 |
| 2003/0136547 A1 | 7/2003 | Gollan et al. | |
| 2009/0229806 A1* | 9/2009 | Lu | F28F 13/187 165/177 |
| 2012/0077055 A1 | 3/2012 | Fujii et al. | |
| 2012/0097373 A1 | 4/2012 | Kandlikar | |
| 2012/0285664 A1* | 11/2012 | Kandlikar | F28F 13/187 165/104.29 |
| 2013/0032311 A1 | 2/2013 | Bhunia et al. | |
| 2013/0206368 A1* | 8/2013 | Yoshikawa | F28F 13/187 165/104.21 |
| 2014/0238645 A1 | 8/2014 | Enright | |
| 2015/0247681 A1* | 9/2015 | Beutler | F28F 1/42 165/179 |

FOREIGN PATENT DOCUMENTS

| | | |
|---|---|---|
| WO | 2013184210 | 12/2013 |
| WO | WO2014031907 A2 | 2/2014 |

OTHER PUBLICATIONS

Supplementary European Search Report and Written Opinion of corresponding EP Application No. 15793355.7 dated Dec. 1, 2017.
Zhonghua Yao et al.; Fabrication of nanowires on orthogonal surfaces of microchannels and their effect on pool boiling; Journal of Micromechanics & Microengineering, Institute of Physics Publishing, Bristol, GB; vol. 22, No. 11, Sep. 25, 2012, p. 115005, XP020231558, ISSN: 0960-1319, DOI: 10.1088/0960-1317/22/11/115005 (abstract provided).
Patil, Chinmay et al.; Pool boiling enhancement through microporous coatings selectively electrodeposited on fin tops of open microchannels; International Journal of Heat and Mass Transfer, vol. 79,Dec. 2014,pp. 816-828, XP029073617, ISSN: 0017-9310, DOI: 10.10.16/J.IJHEATMASSTRANSFER, 2014.08.063 (abstract provided).

* cited by examiner

ENHANCED BOILING WITH SELECTIVE PLACEMENT OF NUCLEATION SITES

CROSS REFERENCE

This application claims the benefit of the filing date of U.S. Provisional Patent Application Ser. No. 61/981,268, filed Apr. 18, 2014 and International Application No. PCT/US2015/026377, filed May 18, 2015, which are hereby incorporated by reference in their entirety.

FIELD

The present disclosure relates to enhanced boiling with selective placement of nucleation sites on a heat transfer surface, and particularly, to enhanced boiling heat transfer with regions having selectively placed nucleation sites and regions lacking selectively placed nucleation sites on a heat transfer surface.

BACKGROUND

There is an increased demand for improved functionality and reliability of microelectronic devices in many diverse applications. Since these factors are adversely affected by temperature, thermal management of these devices is becoming an important consideration. The conventional air cooling systems do not meet the cooling needs of these devices due to low heat transfer performance associated with air cooled systems. Compared to other cooling techniques, pool boiling is attractive due to its ability to remove large amounts of heat at low wall superheats, and absence of any moving parts. Improving pool boiling performance in various heat exchangers is also beneficial in other applications such as power generation, refrigeration, air conditioning, petrochemical, chemical, pharmaceutical and process industries. Improvement in heat transfer will result in lower sizes of equipment being used, higher efficiency and reduced consumption of fossil fuels. This heat transfer can be enhanced either by using active devices such as ultrasonic vibrations, electrostatic fields, and the like, or passive techniques such as porous/microporous surfaces, structured surfaces such as open microchannels (microgrooves), finned or knurled surfaces, and the like. Thus, for enhancement in pool boiling heat transfer performance, enhancement in both the critical heat flux (CHF) and heat transfer coefficient (HTC), is desired. Similarly, flow boiling is used in many applications and enhancement in flow boiling systems, enhancement in both the CHF and HTC is also desired.

Heat transfer during boiling involves bubble nucleation, its rapid growth and departure. The time from bubble departure to the onset of next bubble nucleation at the same site is the waiting time, and the time it takes from bubble nucleation to reach the departure stage is the growth time. During this cycle, the bubble interface movement causes liquid around it to flow over the surrounding heat transfer surfaces. The periodic bubble departure causes the heater surface to undergo a transient temperature cycle, which provides heat to the renewed liquid layer as it replaces the liquid displaced by the bubble. In flow boiling, the localized velocity fields generated by the departure of the nucleating bubbles play a similar role, although the flow of liquid and vapor in the bulk flow modified this behavior to some extent depending on the bulk flow velocity and heat flux levels. Nevertheless, enhancing heat transfer performance due to nucleating bubbles is beneficial in flow boiling systems as well.

SUMMARY

In accordance with one aspect of the present disclosure, there is provided a heat transfer system including a substrate having a heat exchange region including a surface having an enhancement region including alternating regions of selectively placed plurality of nucleation sites and regions lacking selectively placed nucleation sites, wherein a width of the region of selectively placed nucleation sites includes a distance of from about 100 µm to about 4 mm and a width of the region lacking selectively placed nucleation sites includes a distance of from about 100 µm to about 4 mm, such that bubble formation and departure in the region of selectively placed nucleation sites during boiling of a liquid in contact with the enhancement region induces liquid motion over the surface of the regions lacking selectively placed nucleation sites sufficient to enhance both the critical heat flux and heat transfer coefficient at the critical heat flux in the enhancement region of the system as compared to the heat exchange region surface wherein the enhancement region is replaced by a plain surface.

These and other aspects of the present disclosure will become apparent upon a review of the following detailed description and the claims appended thereto.

DETAILED DESCRIPTION

Figure 1:
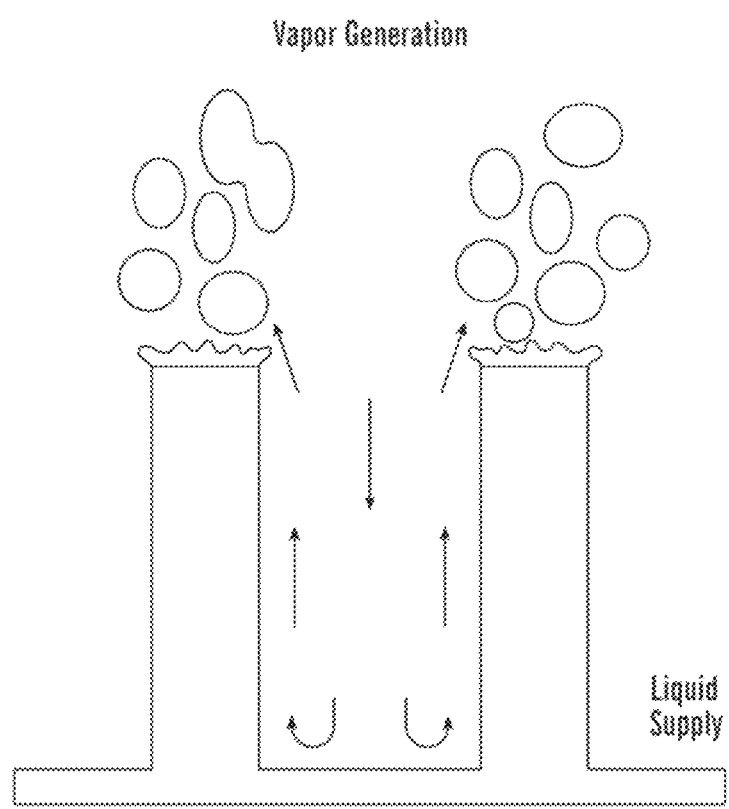
FIG. 1 is a drawing of a schematic of an embodiment displaying liquid motion caused by bubble departure of the present disclosure.

The present disclosure relates to a heat transfer system including a substrate for liquid boiling. The substrate can include copper, copper alloy, aluminum, steel, nickel, titanium, alloys, silicon, germanium, a composite of different materials including films, or any suitable material for boiling applications. The heat transfer system in accordance with the present disclosure includes a substrate for liquid boiling having a heat exchange region in which heat is transferred between the substrate and a fluid in communication with the substrate. The substrate can include a planar surface, curved surface, tubular surface, or combinations thereof.

The heat exchange region includes a heat transfer surface having an enhancement region having regions of selectively placed plurality of nucleation sites (NS region) and regions lacking selectively placed nucleation sites (LNS region). The regions of selectively placed nucleation sites induce bubble formation and departure that cause convective liquid flow over regions lacking selectively placed nucleation sites enhancing both critical heat flux and heat transfer coefficient. The enhancement region is composed of the combination of the NS and LNS regions, which may be placed in specific regions of the heat transfer region. The enhancement region may include alternating NS and LNS regions and may be surrounded by an NS region, an LNS region or any other type of surface. Selectively placed nucleation sites nucleate at low wall superheat as compared to regions lacking selectively placed nucleation sites. Nucleation sites may be selectively placed by a microporous layer, laser holes, reentry cavity formation, and other surface geometry suitable for nucleating bubbles at lower wall superheats. Tall nanowires result in bunching and provide nucleation sites along with improved wettability. The regions of selectively placed nucleation sites and regions lacking selectively placed nucleation sites can be on the surface of the substrate or on the top or side surface of microstructures, which may be located on the substrate.

Regions lacking selectively placed nucleation sites may include features or coatings to change the surface wettability characteristics. When the coatings are hydrophilic, they will enhance liquid wetting and delay CHF. Although, tall nanowires result in bunching and provide nucleation sites along with improved wettability, short nanowires do not bunch and may provide only wettability improvements and not nucleation sites. Such wettability improving, non-nucleating nanowires may be placed in the LNS region. A wicking structure may also be used to improve the wettability. Such wicking structure on the LNS surface provides an added advantage of providing a liquid pathway on the surface in the lateral (along the surface) direction.

The LNS region may be obtained by removing the nucleation sites placed initially in these regions. For example, a surface may be initially coated with a microporous layer for creating nucleation sites and then removing this coating from the regions where LNS region is desired. The LNS region may be covered with microstructures or surface features to enhance convective heat transfer with the liquid. Suitable microstructures include a microchannel, fin, pin fin, a microporous layer, and the like.

This disclosure deals with boiling of liquids wherein bubble nucleation occurs and is accompanied with transfer of heat from a surface to the boiling liquid. A nucleation site is defined as the location where a bubble nucleation occurs. Selective placement of nucleation sites is identified as the region where a plurality of nucleation sites is placed on the heat transfer surface to enhance nucleation. The nucleation occurring in the region of selectively placed nucleation sites supports the mechanism of liquid-vapor circulation and heat transfer described herein. A region lacking selectively placed nucleation sites refers to a region of the heat transfer surface where nucleation sites are not placed, although some nucleation may occur in this region, from for example, naturally occurring nucleation sites as a result of fabrication process. A microstructure is defined as a structure generally from about 0 micrometer to about 4 millimeters in one of its dimensions on the heat transfer surface. It also forms part of the heat transfer surface. It includes, but is not limited to microchannels, pin fins, and elevated or depressed regions. A liquid channel is defined as a region which experiences a liquid flow on the heat exchange surface as a result of bubble activity in the adjacent regions, which is generally the region with selectively placed nucleation sites. This liquid flow does not refer to liquid motion immediately around a nucleating bubble in what is called as the influence region around a bubble. The channel can be flush with the heat transfer surface, or it may be elevated or depressed from the heat transfer surface. A liquid channel can be formed due to the selective placement of the nucleation sites or could be created through the placement of microstructures or through a combined effect of the two. Microstructures can be arranged such that there is spacing between the structures to permit convective liquid flow about the structures induced by bubble departure from the NS regions.

Selective placement of nucleation sites refers to placement of nucleation sites in a region on the heat transfer surface and on any microstructures present on the heat transfer surface. Examples of selective placement of nucleation sites include, but are not limited to: placing nucleation sites on (i) part or the whole top region of fins forming a microchannel or any microstructure, (ii) part or the whole region of side walls of a microstructure, (iii) part and the whole region of: side walls and/or bottom regions of a microchannel or a microstructure, or (iv) patterns created by nucleating regions in strips, bands or any other shape. These nucleation regions provide a region where bubbles are nucleated preferentially and liquid flows over the regions or channels lacking selectively placed nucleation sites.

Wall superheat is defined as the difference between the substrate surface temperature and the saturation temperature of the liquid. Heat transfer coefficient is defined as the ratio of heat flux dissipated by the substrate and the wall superheat. The CHF condition is initiated by a blanket of vapor over the heater surface preventing the liquid from coming in contact with the heater surface. Under constant heat flux heating condition, reaching CHF leads to a rapid increase in heater surface temperature and may cause thermal damage to the surface (also known as burnout). In a boiling curve, the wall superheat is plotted on the x-axis against the heat flux on the y-axis. CHF represents the highest heat flux beyond which an increase in heat flux is accompanied with a significant rise in wall temperature and a dramatic reduction in heat transfer coefficient as compared to the boiling prior to reaching the CHF condition.

The widths of the two regions, one with selective placement of nucleation sites (NS region) and one lacking selectively placed nucleation sites (LNS region) are important parameters that influences the enhancement in both critical heat flux (CHF) and heat transfer coefficient (HTC) in the following ways. Nucleation occurs over the NS region and bubbles depart from this region. This induces liquid from the bulk to flow toward the region lacking selectively placed nucleation sites (LNS region). Liquid flow along the heater surface in the LNS region is also induced due to flow paths available in the LNS region. Liquid is supplied to the NS region from the boundaries of the LNS and NS region and also from some counterflow of liquid in the chaotic motion of bubbles as they depart the heat exchange surface. Having an NS region too wide reduces the available area in the LNS region where substantial enhancement can occur and may weaken the liquid convection current over the LNS region. Providing an LNS region between two adjacent NS regions causes the liquid from the bulk to flow towards the LNS region. This causes a convection current over the LNS region. Making the LNS region width too large makes the convection current weak and also there is a loss of area available for nucleation in the NS region as a larger fraction of the surface is occupied by the LNS region. The net result of making the widths of the NS and LNS regions wide beyond certain points is a loss in performance in either CHF or HTC, or both.

On the other hand, making the LNS region width (spacing between two NS regions covered by the LNS region) too small makes it difficult for the liquid from the bulk to flow toward the LNS region. The bubbles departing the heater surface adversely affect the flow of liquid towards the LNS region. The resulting weak convection currents reduce the convective heat transfer in the LNS region and the overall heat transfer performance. The interaction of the incoming liquid with the outgoing bubbles near the heat exchange surface adversely affects the liquid convection currents. There are many additional effects due to bubble coalescence and instabilities of the liquid-vapor interface and flow that influence the velocity of liquid in the LNS region. When the width of the LNS region is near optimum, the incoming liquid velocity is high since the width is not too large and the interaction with the departing bubbles is small because the width in not too small. The liquid flow in the LNS region is also induced laterally in the LNS region as a result of the bubbles departing from the NS region due to the heater surface topography. Making the width of the NS region too small may reduce the nucleating bubble density and the resulting liquid convective current in the LNS region may be weak.

In an embodiment, the bubble escape pathway is in the vertically upward direction from the region of selectively placed nucleation sites (NS) from a horizontal heat exchange surface in a gravity driven system. However, the bubbles may be removed under the influence of any other force away from the nucleation sites in this or other orientations such that they do not interfere with the convective liquid flow pathway towards the regions lacking selectively placed nucleation sites (LNS).

The flow resistance offered by a bubble removed from the region with the selectively placed nucleation sites (NS) to the convective flow of the liquid over the region lacking selectively placed nucleation sites (LNS) can be minimized by providing a spacing of the region lacking selectively placed nucleation sites (LNS) such that the CHF is enhanced by at least about 50 percent as compared to a plain surface and HTC at CHF is enhanced by at least about 50 percent as compared to a plain surface. Further, in another embodiment the CHF is enhanced at least by about 100 percent as compared to a plain surface and HTC at CHF is enhanced at least by about 50 percent as compared to a plain surface. In yet another embodiment, the CHF is enhanced by at least about 150 percent as compared to a plain surface and the HTC at CHF is enhanced by at least about 50 percent as compared to a plain surface. In yet another embodiment, the CHF is enhanced by at least about 200 percent as compared to a plain surface and the HTC at CHF is enhanced by at least about 50 percent as compared to a plain surface. A comparative plain surface is defined as a surface lacking microchannels, coatings, and selectively placed nucleation sites.

In another embodiment, the CHF is enhanced at least by about 100 percent and the HTC at 80% of the CHF is enhanced by at least about 50 percent.

In another embodiment, the CHF is enhanced at least by about 100 percent and the HTC at 80% of the CHF is enhanced by at least about 100 percent.

In another embodiment, the CHF is enhanced at least by about 100 percent and the HTC at 80% of the CHF is enhanced by at least about 150 percent.

In another embodiment, the CHF is enhanced at least by about 200 percent and the HTC at 80% of the CHF is enhanced by at least about 50 percent.

In another embodiment, the CHF is enhanced at least by about 200 percent and the HTC at 80% of the CHF is enhanced by at least about 100 percent.

In another embodiment, the CHF is enhanced at least by about 200 percent and the HTC at 80% of the CHF is enhanced by at least about 150 percent.

In another embodiment, the CHF is enhanced at least by about 100 percent and the HTC at 60% of the CHF is enhanced by at least about 50 percent.

In another embodiment, the CHF is enhanced at least by about 100 percent and the HTC at 60% of the CHF is enhanced by at least about 100 percent.

In another embodiment, the CHF is enhanced at least by about 100 percent and the HTC at 60% of the CHF is enhanced by at least about 150 percent.

In another embodiment, the CHF is enhanced at least by about 200 percent and the HTC at 60% of the CHF is enhanced by at least about 50 percent.

In another embodiment, the CHF is enhanced at least by about 200 percent and the HTC at 60% of the CHF is enhanced by at least about 100 percent.

In another embodiment, the CHF is enhanced at least by about 200 percent and the HTC at 60% of the CHF is enhanced by at least about 150 percent.

The desirable spacing range between the regions depends on the liquid and vapor properties and the bubble nucleation characteristics in the NS region. It is found from current experiments that a suitable range is between about 100 µm and about 4 mm. A heat exchange region may be designed for improving heat transfer coefficient at lower heat fluxes or for extending the CHF or extending the CHF while simultaneously improving the HTC at CHF. The specific dimensions of the NS and LNS regions and the bubble nucleation characteristics in the NS regions can be determined accordingly.

In an embodiment, a heat transfer system includes a substrate having a heat exchange region. At least a portion of the surface of the heat exchange region includes an enhancement region. The enhancement region includes alternating regions of selectively placed plurality of nucleation sites and regions lacking selectively placed nucleation sites. A width of the regions of selectively placed nucleation sites includes a distance of from about 100 µm to about 4 mm and a width of the regions lacking selectively placed nucleation sites includes a distance of from about 100 µm to about 4 mm. Thus, these regions may include other width distances outside this range, so long as they contain sufficient width distances within this range to provide the desired enhancement. The architecture is such that bubble formation and departure during boiling of a liquid in contact with the enhancement region induces liquid motion over the surface of the regions lacking selectively placed nucleation sites sufficient to enhance both the critical heat flux and heat transfer coefficient in the enhancement region of the system as compared to the heat exchange region surface wherein the enhancement region is replaced by a plain surface.

The enhancement region can further include microstructures having a height of from about 0 µm to about 4 mm. The microstructures can have a width of from about 100 µm to about 4 mm. The channel gap between the microstructures can have a width of from about 100 µm to about 4 mm.

In an embodiment, the enhancement region surface can include, for example, a plurality of microstructures having side and top surfaces extending from the substrate surface resulting in a cross-section of microstructure top surfaces, microstructure side surfaces, and substrate surfaces. At least one of the microstructure top surfaces, microstructure side surfaces, and substrate surfaces includes regions of selectively placed plurality of nucleation sites and the other of those surfaces not having such nucleation sites include regions lacking selectively placed nucleation sites, such that during boiling of a liquid within the enhancement region bubble formation at the surfaces of the regions of selectively placed nucleation sites is preferred over bubble formation at the other surfaces to the extent of inducing and sustaining convective liquid flow over the other surfaces lacking selectively placed nucleation sites of the enhancement region. Thus, the other surfaces which have regions lacking selectively placed nucleation sites can be the microstructure side surfaces and the substrate surfaces; the microstructure top surfaces and the microstructure side surfaces; the microstructure top surfaces and the substrate surfaces; the microstructure top surfaces; or the substrate surfaces. In an embodiment, nucleation sites may be selectively placed on a portion of the microstructure. Thus, a region of selectively placed plurality of nucleation sites may overlap different portions or surfaces of a microstructure.

Figure 2:
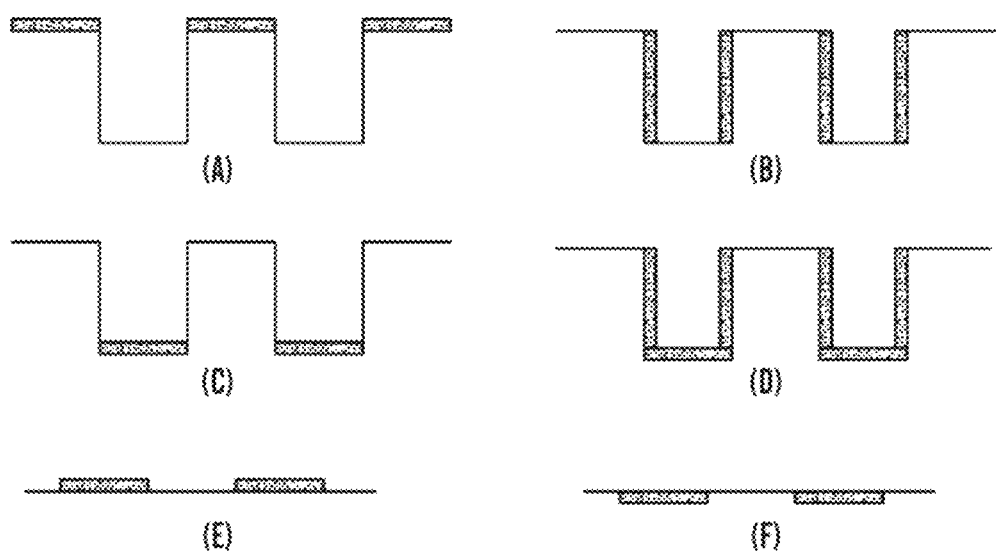
FIG. 2 is a drawing showing examples of enhancement regions where regions of selectively placed plurality of nucleation sites are shown as shaded regions on microchannel surfaces in accordance with the present disclosure.

FIG. 2 illustrates examples of enhancement regions of selectively placed nucleation sites and regions lacking selectively placed nucleation sites on a heat transfer surface. Selectively placed nucleation sites are shown as shaded regions on the heat transfer surface. FIGS. 2(A)-2(D) show selective placement of nucleation sites on different regions of a microchannel. FIG. 2(A) shows nucleation sites on top of the fin; FIG. 2(B) shows nucleation sites on the side walls; FIG. 2(C) shows nucleation sites on the bottom walls of a microchannel; FIG. 2(D) shows nucleation sites on the side and bottom walls of a microchannel; FIG. 2(E) shows surface regions of selectively placed nucleation sites protruding above surface regions lacking selectively placed nucleation sites; and FIG. 2(F) shows surface regions of selectively placed nucleation sites flush with surface regions lacking selectively placed nucleation sites.

Figure 3:
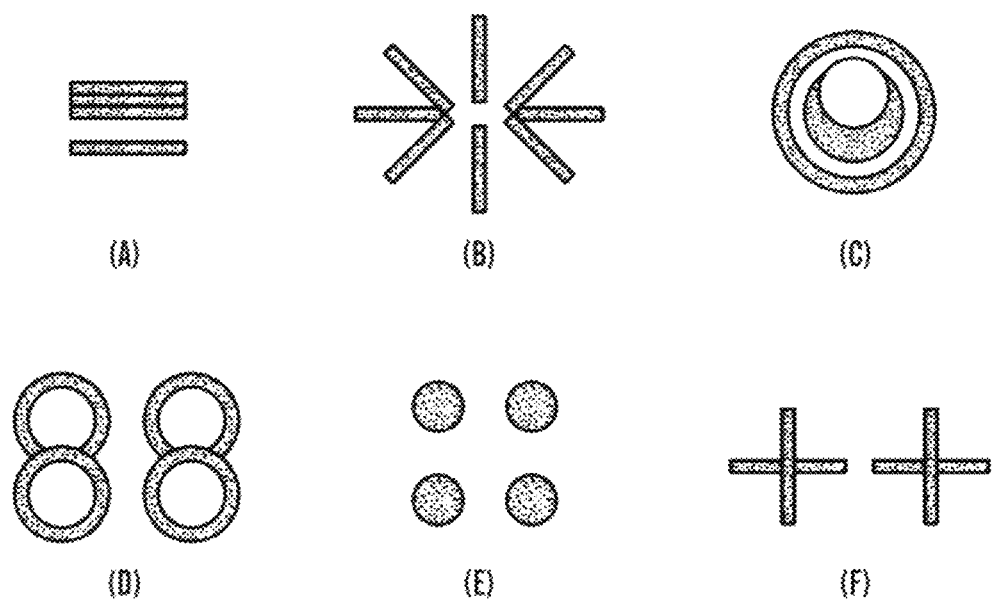
FIG. 3 illustrates examples of shapes and arrangements of enhancement regions where regions of selectively placed plurality of nucleation sites are shown as shaded regions on a heater surface in accordance with the present disclosure.

FIG. 3 illustrates examples of different shapes and different arrangements of enhancement regions of regions of selectively placed nucleation sites and regions lacking selectively placed nucleation sites on a heater surface suitable for use in the present disclosure. Selectively placed nucleation sites are shown as shaded regions on the heat transfer surface. FIGS. 3 (A)-3(F) show different configurations of regions of selectively placed nucleation sites. FIG. 3(A) shows strips placed parallel and a spacing; FIG. 3(B) shows a star shaped configuration; FIG. 3 (C) shows concentric annular rings; FIG. 3 (D) shows annular rings placed in a pattern; FIG. 3 (E) shows circular regions placed in a pattern; and FIG. 2 (F) shows strips placed in multiple + symbols. The liquid flow and enhancement in these geometries is determined by the cumulative effect of different spacing at different specific locations across the NS and LNS region. Although at least a portion of the preferred spacing is present, the configurations may also contain spacing beyond the maximum and minimum specified earlier, so long as the overall influence of these geometrical placements on the bubble flow path and its interaction with the liquid flow meet the desired performance parameters. For example, a + shaped NS region allows for the varied spacing of the LNS region to extend from zero at the intersection of the two NS regions of the + shape, but the performance may be improved due to liquid flow from other broader LNS regions farther away from the crossing point of the + shape. Similarly, other shapes and placements of multiple shapes of the NS region separated by the LNS region may provide enhanced performance. While such configurations are developed, it is important to select the desired widths and spacing of the NS and LNS regions and shapes so as to avoid formation of localized regions where liquid cannot reach the LNS region because of the departing bubbles, or liquid cannot reach the nucleation sites in the NS region.

The regions of nucleation sites may be formed by any technique that promotes bubble nucleation during boiling. This includes, but is not limited to, sintering of metal particles, etching, electrochemical deposition, chemical vapor deposition, roughening, scraping, and the like.

An intrinsic mechanism relating to this disclosure is that the bubbles generated over the selectively placed nucleation sites generate a liquid flow over, including flow towards the substrate and along the substrate, the regions lacking selectively placed nucleation sites or channels such that critical heat flux for the combined surface is enhanced at least by about 100 percent as compared to a plain surface without any microstructures and the maximum heat transfer coefficient in the vicinity of critical heat flux is enhanced by at least about 50 percent as compared to a plain surface.

Suitable microchannels can be formed by plain or contoured sidewalls which are from 0 to about 4 mm deep and from about 100 micrometer to about 4 mm wide. The microchannels may be straight, with sharp or smooth turns, or with specific shapes such as spiral, wavy, star-shaped, and the like. The cross-section of the microchannel may be rectangular, triangular or any other shape. Regions of selectively placed nucleation sites can be placed on the top of the fins, or on the bottom of the microchannel, or on the sidewalls of the microchannels, or any combination, or portions thereof. The remaining regions can be regions lacking selectively placed nucleation sites.

The substrate may be plain or it may have suitable microstructures of different shapes, including pin fins of any cross-section or dimension. The height of the microstructures is in the range of 0 (for a plain surface) or up to about 4 mm, with preferred nucleation regions placed on any of the top regions, side regions, bottom regions, or any combination, or portions thereof. In an embodiment, strips of selectively placed nucleation sites are from about 100 micrometers to about 4 mm wide and placed on the heat transfer surface such that they are separated by another strip of selectively placed nucleation sites by a distance from about 100 micrometers to about 4 mm. The strips may be placed in different patterns including parallel, non-parallel, spiral, helical, triangular, rectangular, elliptical, star-shaped, radial, and the like, as shown in FIG. 3.

In an embodiment, the top surfaces of the microstructures have regions of selectively placed nucleation sites which facilitate bubble formation and the side surfaces of the microstructures and the substrate surface lack regions of selectively placed nucleation sites. The nucleation sites can be selectively placed on the top surface and immediately adjacent to the top surface of the microstructures. In this embodiment, during boiling of a liquid within the heat exchange region bubble formation at the top surfaces of the microstructures is preferred over bubble formation at the side surfaces of the microstructures and substrate surfaces to the extent of inducing and sustaining convective liquid flow over the microstructure side surfaces and substrate surfaces of the heat exchange region. Thus, some bubble formation other than at the top surface or immediately adjacent the top surface can be tolerated provided that convective liquid flow over the side and bottom surfaces of the heat exchange region are maintained.

In an embodiment, the substrate surface has regions of selectively placed nucleation sites which facilitate bubble formation and the top surfaces of the microstructures lack selected regions of nucleation sites. The region lacking selected nucleation sites can be placed on the top surface and immediately adjacent to the top surface of the microstructures. In this embodiment, during boiling of a liquid within the heat exchange region bubble formation at the substrate surfaces is preferred over bubble formation at the top surfaces of the microstructures to the extent of inducing and sustaining convective liquid flow over the microstructure top surfaces. Thus, some bubble formation at the top surface or immediately adjacent the top surface can be tolerated provided that convective liquid flow over top surfaces of the microstructures in the heat exchange region are maintained. The enhancement region is applicable to boiling systems. It is applicable to pool boiling systems. It is also applicable to other systems, such as flow boiling systems, in which a liquid or liquid-vapor mixture flows over the heat transfer region.

In an embodiment, a boiling substrate having a flat surface or a surface with microchannel height reduced to zero or close to zero also yields a similar enhancement effect. The width of the regions of selectively placed nucleation sites and the width of regions lacking selectively placed nucleation sites play a role on the overall enhancement achieved. Coating the regions lacking selectively placed nucleation sites with hydrophilic coatings improves the wettability and improves critical heat flux. Placing additional secondary microfeatures on the regions lacking selectively placed nucleating sites improves critical heat flux and/or heat transfer coefficient at CHF.

In an embodiment, the substrate can be the outside surface of a tube subjected to liquid boiling over it. The outside tube surface is covered with microstructures, and regions of selectively placed nucleating sites and regions lacking selectively placed nucleation sites.

In an embodiment, the substrate can be the outside surface of a tube subjected to liquid boiling over it. The outside tube surface is covered with regions of selectively placed nucleating sites and regions lacking selectively placed nucleation sites.

A system composed of microchannels provides a unique opportunity to enhance the heat transfer within the system. In accordance with an embodiment of the present disclosure, when bubbles are primarily grown on the top surface of microchannel fins, the departing bubbles will cause a liquid motion in the channels surrounding the fins in the immediate vicinity of the departing bubble. In this case it is desirable to not have any bubble nucleation in the channels, as the channels are the main provider for the liquid to the heater surface near the nucleation site after a bubble departs. Also, the circulation set up by the departing bubble and incoming liquid prevents vapor to build up and cover the heater surface which would otherwise lead to a critical heat flux condition.

FIG. 1 illustrates an embodiment of a schematic of the mechanism of the present disclosure. The microchannels are made of smooth surfaces, while the fin top surfaces and fin surfaces adjacent the top surface are covered with a structure that is a microporous layer with nucleation cavities that nucleate at lower wall superheats than those present on the microchannel surfaces without such layers. The liquid motion caused by the bubble departure is also illustrated in FIG. 1. In addition to that shown, the liquid can traverse along the length of the microchannels. A microporous layer is defined as a matrix with voids that are smaller than about 500 micrometers (micron) in dimension, preferably smaller than about 100 μm in dimension, more preferably in the range of from about 1 to about 30 μm depending on the fluid, flow and microstructure configuration. The microporous structure may be composed of copper, graphene, carbon, silicone nanowires, carbon nanowires, or any suitable material or combinations thereof.

There are a number of techniques which can be used to fabricate this geometry. The microchannel can be replaced with other modulated structures, such as fins, pin fins, and the like as described in detail subsequently. The resulting structure provides very high heat transfer rate at a lower wall superheat conditions. The details of the technique and the results of pool boiling experiments are described in the following sections. This could be applied with other fluids including but not limited to water, refrigerants, dielectric fluids, cryogens, other pure liquids and mixtures.

A combination of microchannels and microporous surface on the top area of the fins is developed to enhance the boiling heat transfer. The microchannels are open passages formed between the fins. The fins may be continuous covering the entire one dimension of the boiling surface.

Heat transfer from the regions lacking selectively placed nucleation sites is enhanced by the increased liquid velocity induced by the departing bubbles in the NS region and flowing over these surfaces.

In another embodiment, the fins may be of specific lengths. The fins may be placed in a staggered fashion, or in an in-line fashion. Other arrangements which essentially provide a modulated structure with two level surfaces, defined by the height of the fins as an example, are also included in this disclosure.

The height of the fins in accordance with an embodiment of the present disclosure is estimated to be from about 0 μm to about 4 mm, more preferably from about 0 μm to about 1 mm.

The preferred width of the region of selectively placed nucleation sites, top surface of the fin in this embodiment, is estimated to be from about 100 μm to about 4 mm, more preferably from about 100 μm to about 1 mm.

The preferred width of the region lacking selectively placed nucleation sites, channel or the gap between the fins in this embodiment, is estimated to be from about 100 μm to about 4 mm, more preferably from about 100 μm to about 1 mm.

The NS region may be fabricated by laser drilling, etching, micromachining, microfabrication, mechanical, wire mesh bonding, chemical or any other means.

Microporous coatings may be used for nucleating bubbles in the NS region. The techniques for creating the microporous coating include, but are not limited to: (1) Selective electrodeposition of copper, nanotubes, graphene or any other material. (2) Heat treating electrodeposited surfaces from (1) prepared in each of the steps. (3) Deposit microporous surfaces from (1) or (2) and then machine regions lacking selectively placed nucleating sites or microchannels. (4) Physical vapor deposition or chemical vapor deposition on regions of selectively placed nucleating sites. (5) Selective pressing and sintering of metal or metal oxide powder, composites and mixtures of powder with additives. (6) Sintering metal mesh or metal foams and then machining the regions lacking selectively placed nucleation sites or microchannels. (7) Sintering in a die or sintering while compacting and vice versa. (8) Selective application of mixture of metal powder and a binder using paintbrush, micro nozzles, nebulizers or atomizer. (9) Using rapid prototyping techniques like selective laser sintering, electron beam, aerosol jet printing and the like to deposit selectively. (10) Nanowires that provide nucleation sites. (11) Applying selectively a mixture of powder, solder and a carrier fluid using above mentioned techniques and soldering powder to the base microchannel surface. (12) Metallization, Alloy-de alloying or hot pressing. (13) Foaming with gas, foaming with blowing agent or spray foaming. (14) Application of carbon nanotube or graphene that generate nucleation sites. (15) Microfabrication techniques. (16) Mechanical Processes such as machining, scriving, and the like for generating nucleation sites. (15) Any other technique not listed above which can produce regions of selectively placed nucleation sites and regions lacking selectively placed nucleation sites. The preferred thickness of the microporous layer in the NS region is from about 1 μm to about 4 mm, preferably about 1 μm to about 1000 μm, and more preferably from about 1 μm to about 100 μm.

The microporous surface on top of the microchannels can be created by, for example, one of the two methods described below. In one of the methods, microchannels of an open microchannel surface are coated with suitable material to ensure the coating does not get attached to base or sidewalls of the microchannel. The microporous coating is then deposited on or adjacent the top of the microchannel surface using any suitable technique without destroying the coating inside the microchannels. Once a microporous surface is deposited on top of the fin, the coating inside the microchannel can be removed using any suitable technique that will remove the material, but will not harm the microchannel surface or its coating. In another technique, a plane surface is coated with a microporous surface using any suitable technique. The microchannels are then made on the surface using any suitable techniques like grinding, etching, and the like removing the microporous layer over the top of microchannels but not harming the surface on top of the fins.

The present disclosure could be used in a wide range of heat transfer applications including cooling of chips and integrated circuits. This disclosure will facilitate miniaturization of the electronic components. Apart from cooling of chips and integrated circuits, this can be used in a wide variety of heat exchangers including steam generators in power plants, refrigeration evaporators, air conditioning evaporators, desalination evaporators, chemical and petrochemical distillation equipment and the like.

This technique can be used in wide array of cooling applications from microelectronic components to high performance evaporators and heat exchangers, as this technique has a capacity of carrying out large amount of heat at relatively low surface temperatures, yielding extremely high heat transfer coefficients and high heat fluxes.

The disclosure will be further illustrated with reference to the following specific examples. It is understood that these examples are given by way of illustration and are not meant to limit the disclosure or the claims to follow.

Example 1

Figure 4:
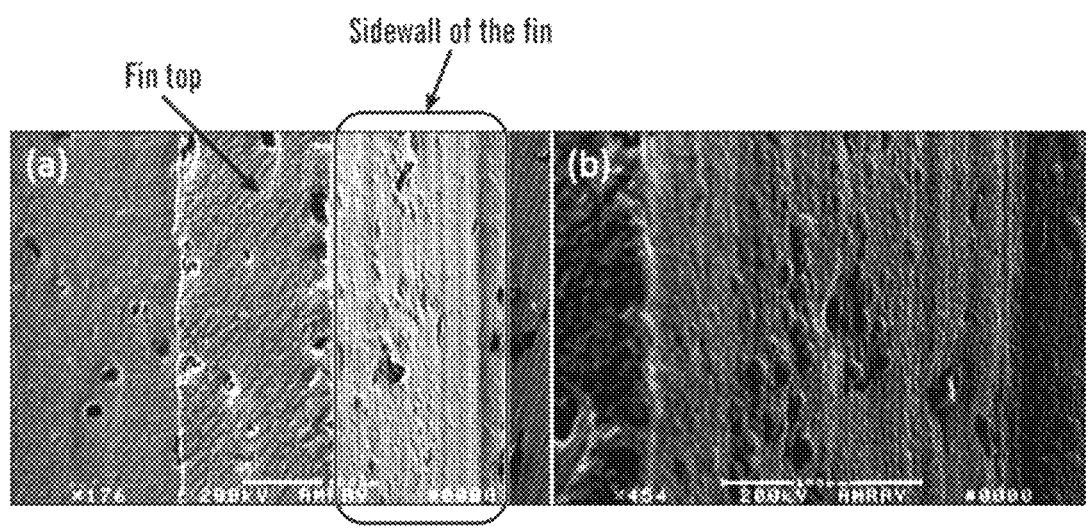
FIG. 4 is an angled SEM of a fin showing (a) lower magnification view of sidewall, fin top, and base of the channel showing fin tops coated with a microporous layer and (b) side wall showing machine marks indicating no traces of deposition on the sidewalls.

The microporous surface is selectively deposited on the top surface of the fin. FIGS. 4(*a*) and 4(*b*) clearly show the machine marks on the sidewalls indicating no traces of deposition. The contact angle of the surface was 3°.

Figure 5:
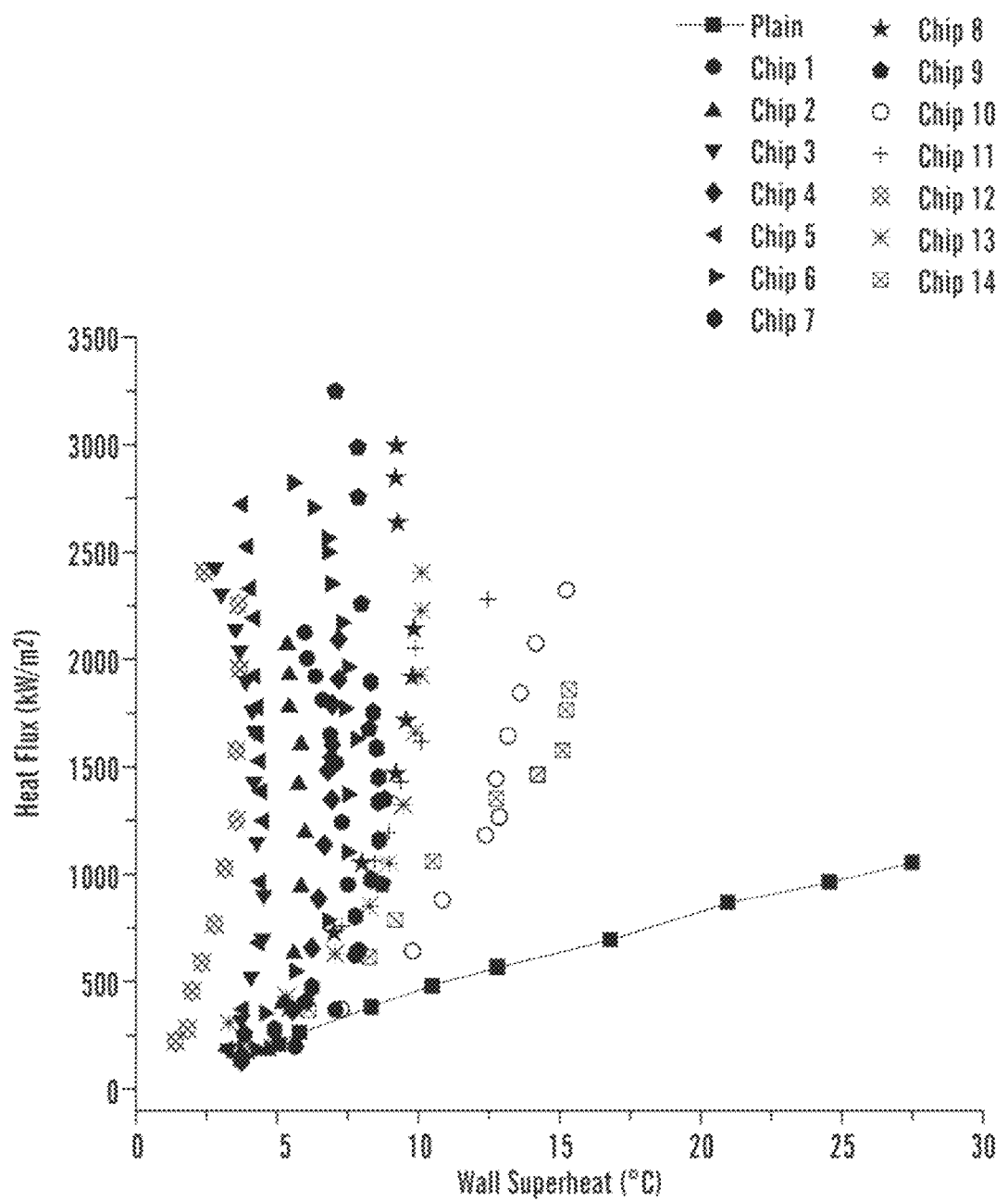
FIG. 5 is a graph showing pool boiling curves for test chips, using projected heater area with saturated distilled water at atmospheric pressure.

The prepared surface was tested for pool boiling performance. The pool boiling performance is shown in FIG. 5, when tested with distilled water. The fin width, channel width and channel depth for the test specimen were 200 μm, 762 μm and 400 μm, respectively. This microchannel surface was coated with a microporous surface of approximately 70 μm. The plain microchannel surface had a critical heat flux of 1,920 kW/m$^2$ at a wall superheat of 10° C., yielding a heat transfer coefficient of 192 kW/m$^{2\circ}$ C. The coated microchannel surface on the other hand yielded a critical heat flux at 2,410 kW/m$^2$ and wall superheat of 2.45° C. This yielded a heat transfer coefficient of 995 kW/m$^{2\circ}$ C. Thus, the enhanced surface displayed enhancement of 425% in heat transfer coefficient as compared to a microchannel surface, and 2000% as compared to a flat surface.

An array of test sections were prepared for pool boiling enhancement with water as described in the following Table 1.

TABLE 1

Test matrix showing dimensions of the microchannels, number of channels, parameters for electrodeposition process, and coating thickness.

| Chip No. | Fin width (μm) | Channel width (μm) | Channel depth (μm) | Number of channels | current density, step 1 (mA/cm$^2$) | Time, step 1 (sec) | current density, step 2 (mA/cm$^2$) | Time, step 2 (sec) | Thickness of deposit (μm) |
|---|---|---|---|---|---|---|---|---|---|
| 1 | 200 | 300 | 200 | 20 | −400 | 15 | −40 | 2500 | 76.3 |
| 2 | 200 | 300 | 300 | 20 | −400 | 15 | −40 | 2500 | 68.6 |
| 3 | 200 | 300 | 400 | 20 | −400 | 15 | −40 | 2500 | 81.1 |
| 4 | 200 | 400 | 200 | 17 | −400 | 15 | −40 | 2500 | 67.5 |
| 5 | 200 | 400 | 300 | 17 | −400 | 15 | −40 | 2500 | 70.3 |
| 6 | 200 | 400 | 400 | 17 | −400 | 15 | −40 | 2500 | 56.9 |

TABLE 1-continued

Test matrix showing dimensions of the microchannels, number of
channels, parameters for electrodeposition process, and coating thickness.

| Chip No. | Fin width (μm) | Channel width (μm) | Channel depth (μm) | Number of channels | current density, step 1 (mA/cm$^2$) | Time, step 1 (sec) | current density, step 2 (mA/cm$^2$) | Time, step 2 (sec) | Thickness of deposit (μm) |
|---|---|---|---|---|---|---|---|---|---|
| 7  | 200  | 500 | 200 | 15 | −400 | 15 | −40 | 2500 | 79.7 |
| 8  | 200  | 500 | 300 | 15 | −400 | 15 | −40 | 2500 | 72.6 |
| 9  | 200  | 500 | 400 | 15 | −400 | 15 | −40 | 2500 | 73.3 |
| 10 | 200  | 762 | 200 | 10 | −400 | 15 | −40 | 2500 | 80.9 |
| 11 | 200  | 762 | 300 | 10 | −400 | 15 | −40 | 2500 | 81.4 |
| 12 | 200  | 762 | 400 | 10 | −400 | 15 | −40 | 2500 | 63.9 |
| 13 | 500  | 762 | 400 | 8  | −400 | 15 | −40 | 2500 | 61.9 |
| 14 | 1000 | 762 | 400 | 5  | −400 | 15 | −40 | 2500 | 59.6 |

Example 2

This example was conducted to study the effect of fin width (NS region width) and the conclusions from Example 1 above, the following chips were prepared in accordance with Table 2 below.

TABLE 2

Test matrix to study the effect of fin width
(LNS region) on the pool boiling performance

| Chip No. | Fin width, μm | Channel width, μm | Channel depth, μm |
|---|---|---|---|
| 12 | 200  | 762 | 400 |
| 13 | 500  | 762 | 400 |
| 14 | 1000 | 762 | 400 |

Figure 9:
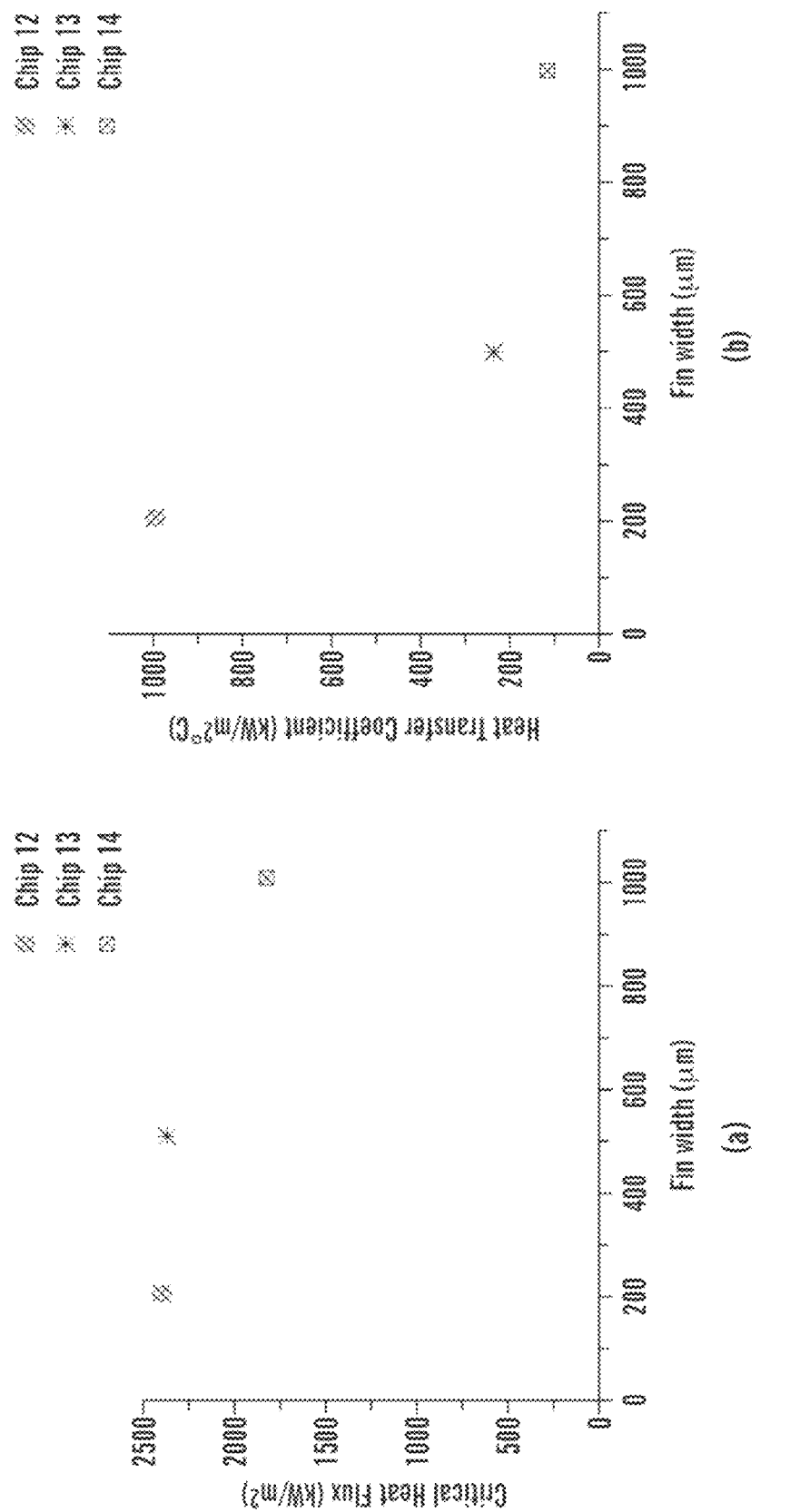
FIG. 9 shows two graphs illustrating effect of fin widths on (a) critical heat flux and (b) heat transfer coefficient.

A comparison of the CHF with NS region width is shown in FIG. 9.

Example 3

Pool boiling tests were conducted over plain and enhanced copper chips using saturated, distilled and degassed water at atmospheric pressure. The test section was made of a 3 mm thick copper chip. Dimensions of the test section are 20 mm×20 mm. The lower side of the test section had a 2 mm wide and 2 mm deep slot creating a 10 mm×10 mm square channel around the heat transfer region on the underside. This slot promotes 1-dimensional heat conduction in the chip. On one of the sides of the test section, a 0.3 mm (300 μm) diameter, 10 mm deep hole was drilled at the center, 1.5 mm from the top surface, for inserting a thermocouple. Open microchannels were machined on the boiling surface using a CNC machine.

After machining the microchannels, the chips were cleaned with isopropyl alcohol (IPA) and distilled water, and further dried using pressurized air. The region with microchannels was left exposed, while the remaining area was electrically insulated for electrodeposition on the heat transfer region only. The microchannels were then filled with a paraffin wax as an electrical insulating material ensuring that only the top surfaces of the fins were exposed to the electrolytic bath. The microchannel chip was connected to cathode and another copper chip of the same dimension as the test chip was connected to the anode. The electrolytic bath consisted of 0.8 M CuSO$_4$ and 1.5 M H$_2$SO$_4$. The current density was set on the software operating the potentiostat. After the electrodeposition process, a microporous coating was obtained only on the top of the microchannel fins. The paraffin wax, used as the sacrificial material, was then removed from the microchannels. Table 1 lists the microchannel dimensions and the electrodeposition parameters employed in preparing the test chips. The chips were then tested for pool boiling performance.

Uncertainty analysis was conducted prior to testing the chips for their pool boiling heat transfer performance. From this analysis it was observed that at lower heat fluxes there is a higher error of 17% associated with heat flux estimation. This error reduces to 3% at heat fluxes higher than 1,000 kW/m$^2$. A heat loss study was conducted to understand the losses of heat from the copper heater. It was observed that variation of temperature is linear, showing that there are minimal losses of heat to the surroundings as compared to the heat transferred to the boiling region of the chip.

Prior to conducting heat transfer experiments, the contact angles for all the test surfaces were measured. They were found to be superhydrophilic with contact angles in the range of 2°-9°. SEM images of the surfaces were taken to compare their morphology. All SEM images were almost identical, as they were prepared without any agitation using the same electrolytic bath composition, current density and time of deposition. All the other chips also had similar SEM images, thus confirming that the morphology of the microporous surfaces on all the microchannel fin tops were identical. Pool boiling experiments were then conducted to study the combined effects of the microporous coatings and microchannels for these chips.

FIG. 5 shows a comparison of pool boiling curves for the Chips 1-14 with different microchannel geometries and one plain chip tested in this investigation. Wall superheats for all tested chips were less than 15° C. A maximum critical heat flux of 3,250 kW/m$^2$ was attained by Chip 9 at a wall superheat of 7° C. This corresponds to an enhancement of 175% in critical heat flux over a plain chip. Chip 8 attained a critical heat flux of 3,000 kW/m$^2$ at a wall superheat of 9.0° C. showing an enhancement of 150% as compared to the plain chip. The lowest critical heat flux observed for a coated microchannel chip was 1,760 kW/m$^2$ for Chip 14, which translates into an enhancement in critical heat flux of 75% over the plain chip.

Another observation can be made regarding the trend in the pool boiling curves for some of the test chips. It is seen that the wall superheat decreases at higher heat fluxes. This is believed to be due to a combination of additional nucleation occurring within the porous structure and the increased liquid motion in the microchannel passages.

Figure 6:
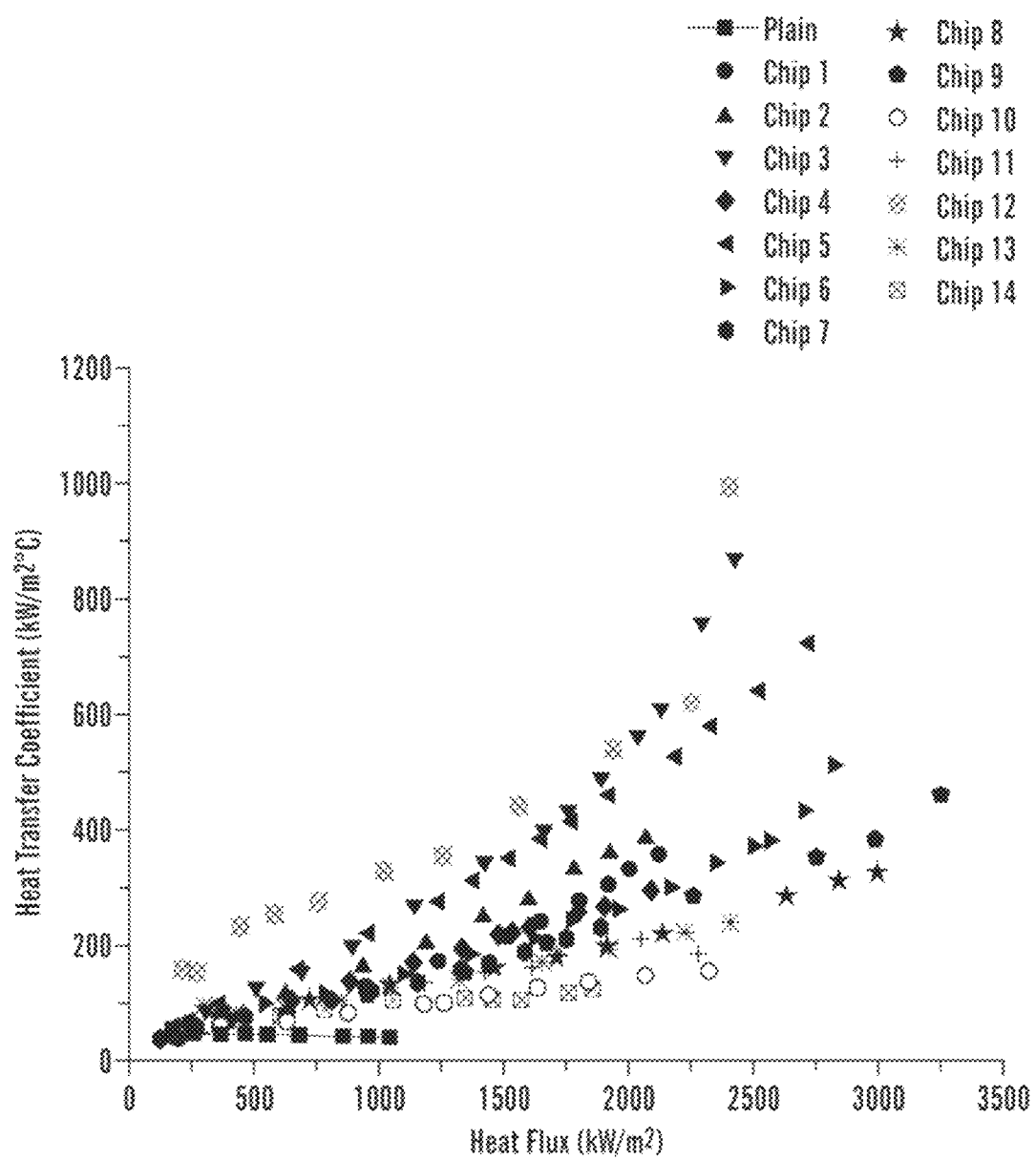
FIG. 6 is a graph showing heat transfer coefficient of the test chips using projected area during saturated pool boiling of distilled water at atmospheric pressure.

FIG. 6 shows the variation of heat transfer coefficient plotted as a function of heat flux. The general trend observed in the plots was that the heat transfer coefficient increased with increasing heat flux. The best performing chip is Chip 12, yielding a record heat transfer coefficient of 995 kW/m$^{2\circ}$ C. at CHF, which represents an enhancement of 2,300% over the plain chip at its CHF. Chip 3 performed similar to Chip 12 yielding a heat transfer coefficient of 867 kW/m$^{2\circ}$ C. and a critical heat flux of 2,400 kW/m$^2$ at a wall superheat of 2.8° C. Chip 10 yielded the lowest value of heat transfer coefficient at 152 kW/m$^{2\circ}$ C. and a critical heat flux of 2,310 kW/m$^2$ at wall superheat of 15.2° C.

Figure 7:
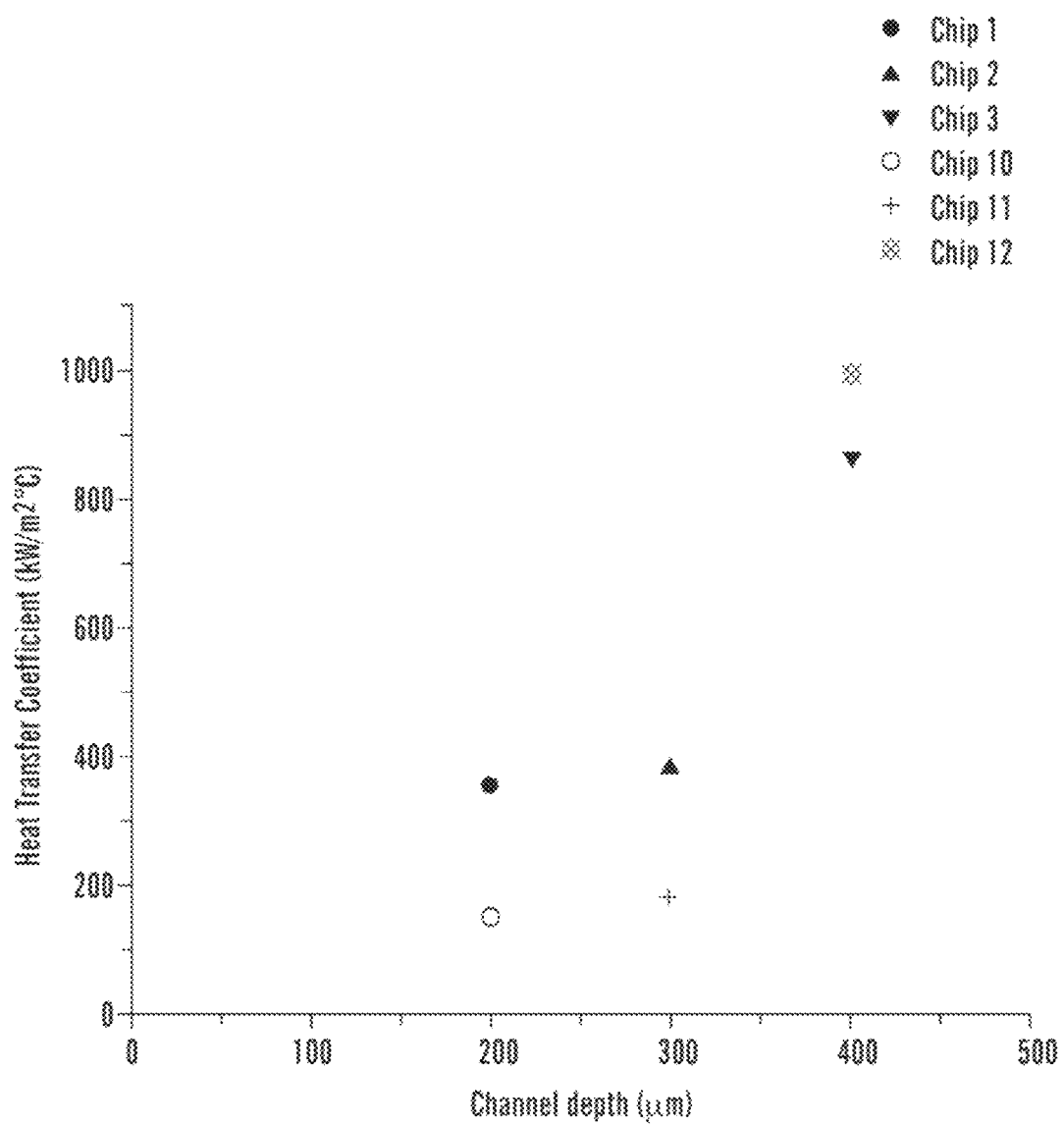
FIG. 7 is a graph showing heat transfer coefficient variation of test chips with channel depth.

Channel depth has an effect on heat transfer performance. FIG. 7 shows the variation of heat transfer coefficient at CHF with increasing channel depths. Chips 1, 2 and 3 show that with an increase in depth of the channels, the associated heat transfer coefficient increases. There is a 10% increase in heat transfer coefficient by increasing depth from 200 μm to 300 μm as seen from performance of Chips 1 and 2. As depth increases to 400 μm, there is an increase of 150% in heat transfer coefficient. A similar trend is observed in Chips 10, 11 and 12. It can be therefore concluded that the deeper channels have greater enhancements as compared to shallow channels over the range of tests conducted. Heat transfer coefficients of Chips 3 and 12 were comparable.

Figure 8:
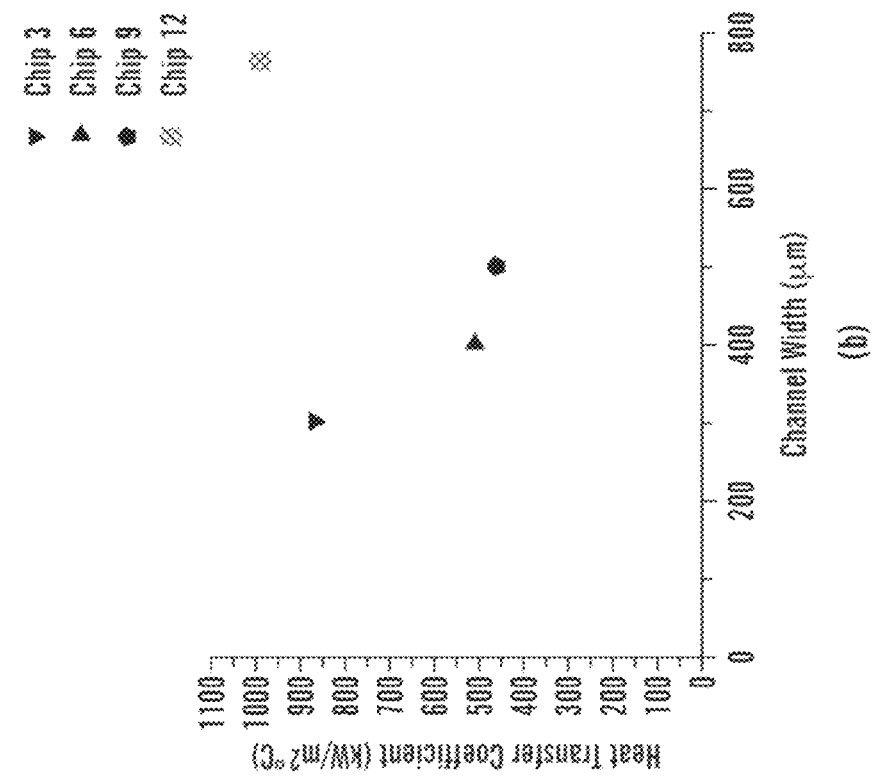
FIG. 8 shows two graphs illustrating effect of channel width on (a) critical heat flux and (b) heat transfer coefficient.
Figure 8:
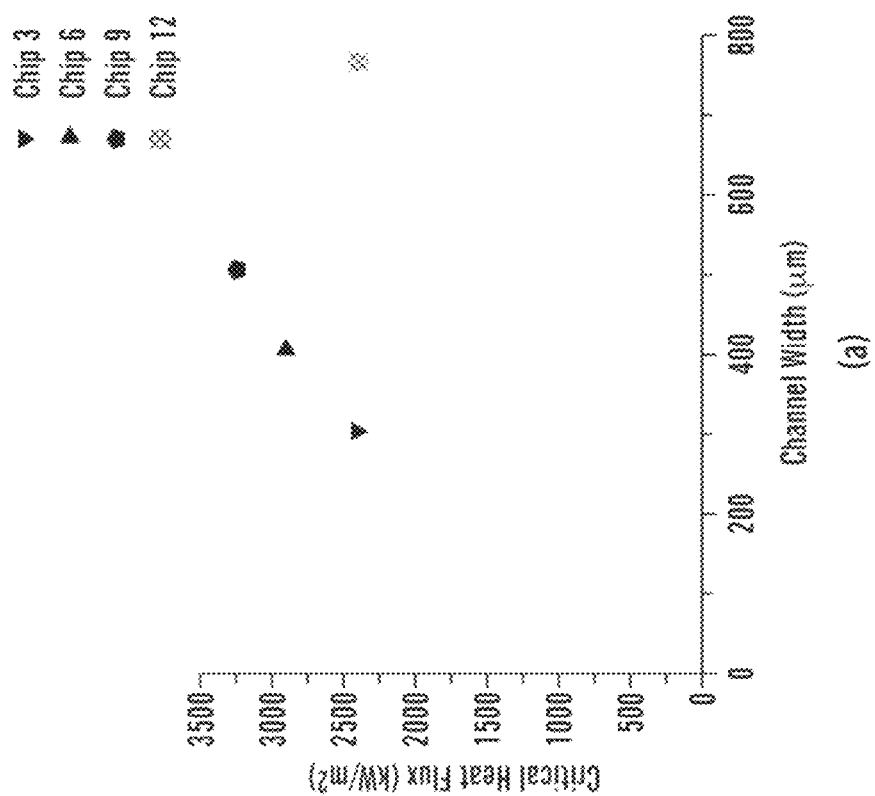

FIGS. 8(a) and 8(b) show the effects of variation in channel width on heat transfer coefficient and critical heat flux. From these plots it can be observed that as the channel width increases, heat transfer coefficient decreases up to a point, beyond which it increases again. From the plot in FIG. 8(a), it can be observed that heat transfer coefficient reduces for Chip 6 and Chip 9 as compared to Chip 3, but increases for Chip 12. Critical heat flux on the other hand increases as channel width increases, but there is a certain value beyond which it starts decreasing. A record highest heat transfer coefficient of 995 kW/m$^{2\circ}$ C. was obtained. For Chip 3 with narrow channels, heat transfer coefficient of 867 kW/m$^{2\circ}$ C. was obtained for Chip 12. Critical heat flux increases from 2,420 kW/m$^2$ (2.42 MW/m$^2$) for Chip 3 to 3,250 kW/m$^2$ (3.25 MW/m$^2$) for Chip 9, and then reduces again to 2,410 kW/m$^2$ (2.41 MW/m$^2$) for Chip 12. From these plots, it can be concluded that to increase critical heat flux, wider channels could be employed, but up to a specific limit.

FIGS. 9(a) and 9(b) show the effect of fin width (NS region width) on critical heat flux and heat transfer coefficient. From the pool boiling curve, it is evident that as the fin width increases, its critical heat flux decreases, and wall superheat increases. Chip 13 has a critical heat flux of 2,400 kW/m$^2$ (2.4 MW/m$^2$). While Chip 14 has a critical heat flux of 1,850 kW/m$^2$ (1.85 MW/m$^2$). Chip 13 shows an enhancement of 100% compared to the plain surface, while Chip 14 shows an enhancement of 55% compared to the plain surface. This is attributed to the increase in latent heat contribution by the bubbles generated over regions of selectively placed nucleation sites which thereby obstruct the flow of liquid towards the regions lacking selectively placed nucleation sites.

FIG. 9(b) shows a comparison of heat transfer coefficient of the Chips 12, 13 and 14. It can be seen that as the fin width increases, its heat transfer performance drops. The highest heat transfer coefficient for Chip 13 was 238 kW/m$^{2\circ}$ C., which is an enhancement of 500% compared to the plain surface, while Chip 14 had a highest heat transfer coefficient of only 121 kW/m$^{2\circ}$ C., which is an enhancement of 200% compared to the plain surface. From this study, it is evident that as the fin width increases, the performance of the test surface drops.

Based on pool boiling tests conducted on Chips 1-14, it can be concluded that for these chips, in order to attain higher heat transfer coefficient and higher critical heat fluxes, either wider (excess of 700 μm) or narrower (less than 400 μm) channels, with depths around 400 μm and fin widths less than 250 μm are preferred for water as the working fluid at atmospheric pressure. However, the range of microstructure dimensions specified here is based on the disclosure stated in Example 1. The performance can be amplified in this range by providing suitable enhancements. One such example is providing a hydrophilic coating in the region lacking selectively placed nucleation sites (LNS) to enhance liquid wetting in the region.

Figure 10:
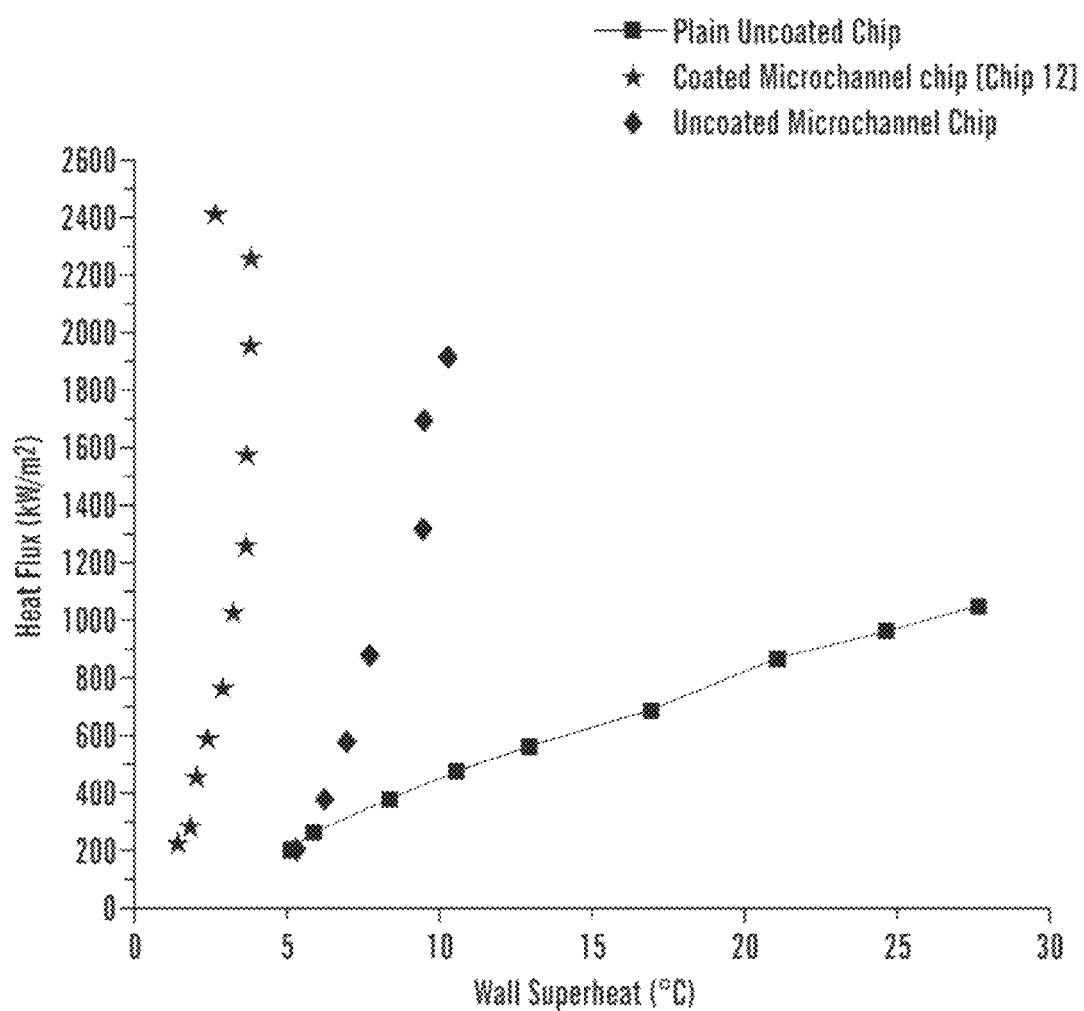
FIG. 10 is a graph of pool boiling curves showing comparison of (i) a microchannel chip with microporous coating on the fin top (Chip 12), (ii) a microchannel chip without any porous coating (Chip 12 without any coating), and (iii) a plain chip (no microchannels, no coating)
Figure 11:
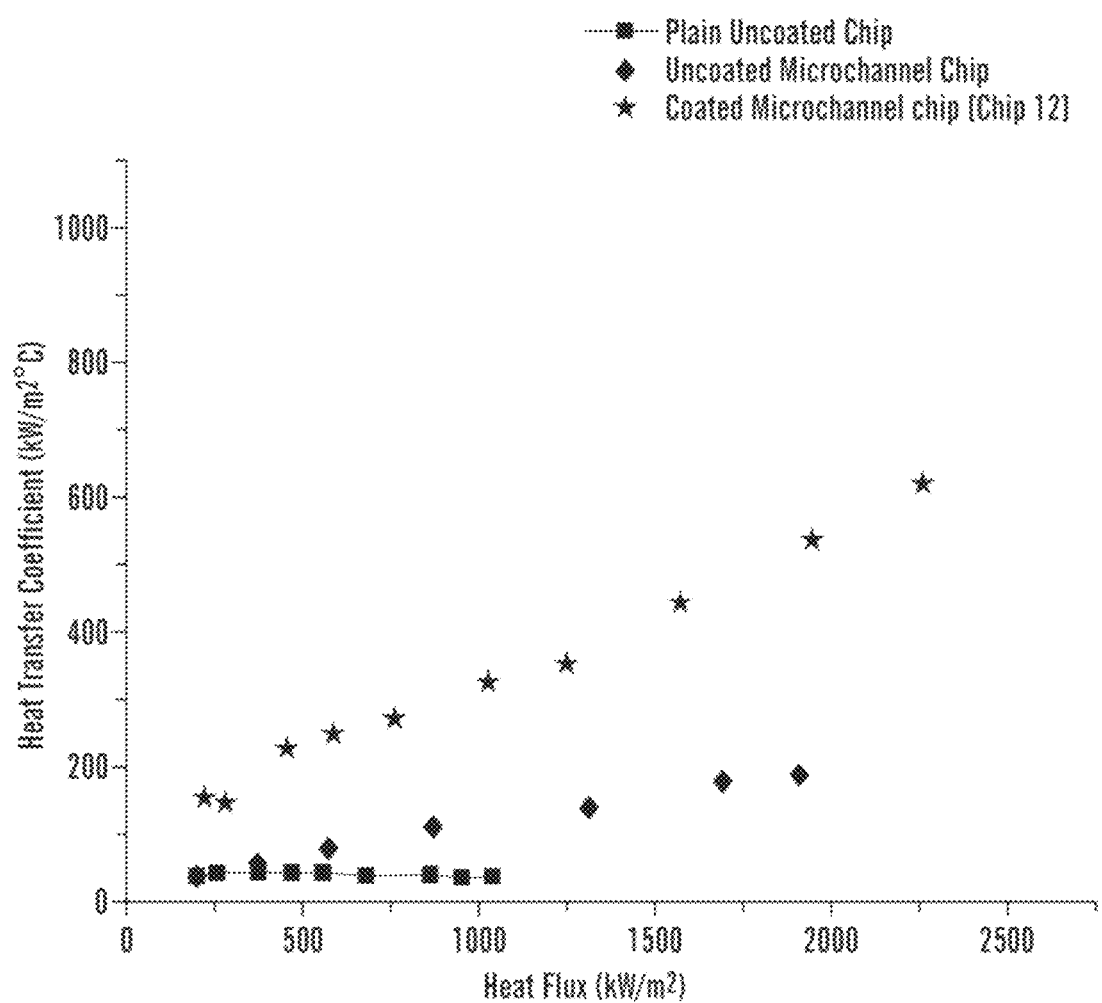
FIG. 11 is a graph of pool boiling curves showing comparison of heat transfer coefficients for (i) microchannel chip with porous coatings on the top (Chip 12), (ii) microchannel chip without any porous coating, and (iii) a plain chip (no microchannels, no coating)

FIG. 10 shows a comparison of pool boiling performance for Chip 12, with a chip of the same dimensions but with an uncoated microchannel surface, and the plain chip. It can be seen from this plot that the critical heat flux of the uncoated microchannel chip was 1,920 kW/m$^2$, which is 30% lower than that for Chip 12. There was a reduction of 600% in wall superheat for Chip 12 as compared to the uncoated microchannel chip. The uncoated microchannel chip had a maximum heat transfer coefficient of 190 kW/m$^{2\circ}$ C. Heat transfer coefficient of coated microchannel chip (Chip 12) at CHF was 425% more than the uncoated microchannel chip and 2,300% more than the plain chip as seen in FIG. 11.

TABLE 3

Critical heat flux and heat transfer coefficient of the test matrix
Table 3. Critical heat flux and heat transfer coefficient of the test matrix for different NS and LNS region widths

| Chip No. | Fin width, μm | Channel width, μm | Channel depth, μm | Number of channels | Critical heat flux (kW/m$^2$) | Heat transfer coefficient (kW/m$^{2\circ}$ C.) |
|---|---|---|---|---|---|---|
| 1 | 200 | 300 | 200 | 20 | 2,120 | 356 |
| 2 | 200 | 300 | 300 | 20 | 2,063 | 384 |
| 3 | 200 | 300 | 400 | 20 | 2,426 | 867 |
| 4 | 200 | 400 | 200 | 17 | 2,088 | 291 |
| 5 | 200 | 400 | 300 | 17 | 2,719 | 720 |
| 6 | 200 | 400 | 400 | 17 | 2,819 | 509 |
| 7 | 200 | 500 | 200 | 15 | 2,269 | 279 |
| 8 | 200 | 500 | 300 | 15 | 2,995 | 326 |
| 9 | 200 | 500 | 400 | 15 | 3,250 | 461 |
| 10 | 200 | 762 | 200 | 10 | 2,319 | 152 |
| 11 | 200 | 762 | 300 | 10 | 2,275 | 183 |
| 12 | 200 | 762 | 400 | 10 | 2,420 | 995 |
| 13 | 500 | 762 | 400 | 8 | 2,405 | 238 |
| 14 | 1000 | 762 | 400 | 5 | 1,855 | 121 |

The heat transfer performances of all chips tested in this study are tabulated in Table 3. All microchannel chips, when tested with saturated distilled water, performed better than the plain chip. The wall superheat for all chips was less than 15° C. Chip 14 had the lowest critical heat flux of 1,855 kW/m$^2$ among the coated chips while Chip 9 had the highest critical heat flux of 3,250 kW/m$^2$. Critical heat flux of the plain chip was under 1,200 kW/m$^2$. A highest heat transfer coefficient of 995 kW/m$^{2\circ}$ C. was obtained for Chip 12. The plain chip had a heat transfer coefficient of 44 kW/m$^{2\circ}$ C. Thus, it could be concluded from the result table that the combination of microchannel with microporous coating on fin tops enhanced pool boiling heat transfer.

The electrodeposition coating technique was applied over fin tops of copper microchannel test chips. The effect of microchannel dimensions fin width, channel width and channel height was systematically studied on pool boiling performance of saturated water over copper substrates at atmospheric pressure. The heat transfer performance comparison was based on their respective critical heat flux and heat transfer coefficient values. These enhanced microchannel chips with electrodeposited microporous coatings on fin tops performed exceptionally well as compared to the plain chip. The performance of these chips is seen to be superior to any other techniques reported in literature. The critical heat flux improved, and a significant reduction in wall superheat was noted. The performance highlights are given below:

Highest critical heat flux of 3,250 kW/m$^2$ at a wall superheat of 7.3° C. for Chip 9.

Highest heat transfer coefficient of 995 kW/m$^2$° C. at a critical heat flux of 2,420 kW/m$^2$ for Chip 12.

The effect of microchannel geometry was also studied. Based on this study, the following observations can be made among the chips tested: Thinner fins performed better than thicker fins. Deeper channels performed better than shallow channels.

A channel width of 762 μm (Chip 12) gave the highest heat transfer coefficient. A channel width of 300 μm (Chip 3) yielded a lower heat transfer coefficient comparable to Chip 12.

Channel width of 500 μm (Chip 9) gave the highest value of critical heat flux. It was observed that as channel width increased from 300 to 500 μm, critical heat flux increased. As channel width increased beyond this value, the critical heat flux dropped, suggesting that there is a desired value of channel width for enhancing critical heat flux for any given construction.

Based on the test results, it is seen that this enhancement technique provides simultaneous high critical heat flux and high heat transfer coefficient performance for pool boiling of water at atmospheric pressure over copper substrates. It is believed that a similar performance enhancement can be obtained with other fluids and under different operating conditions, although the geometrical parameters and electrodeposition process parameters may need to be optimized for those conditions.

The disclosure relates to use of microchannel surfaces having fin tops coated with microporous coatings using any suitable technique for enhancement of pool boiling heat transfer using variety of fluids including water, refrigerants, alcohol, and the like. The microporous coatings contain any conductive metal like copper due to its enhanced heat transfer properties. The channels are filled with coatings to cover the area, and prevent any porous copper coating from developing in that region. The filling can be removed using any suitable technique without disturbing the integrity of the microporous surface. Different geometries of microchannels tested to evaluate their heat transfer performance produced a highest value of 995 kW/m$^2$° C.

Figure 12:
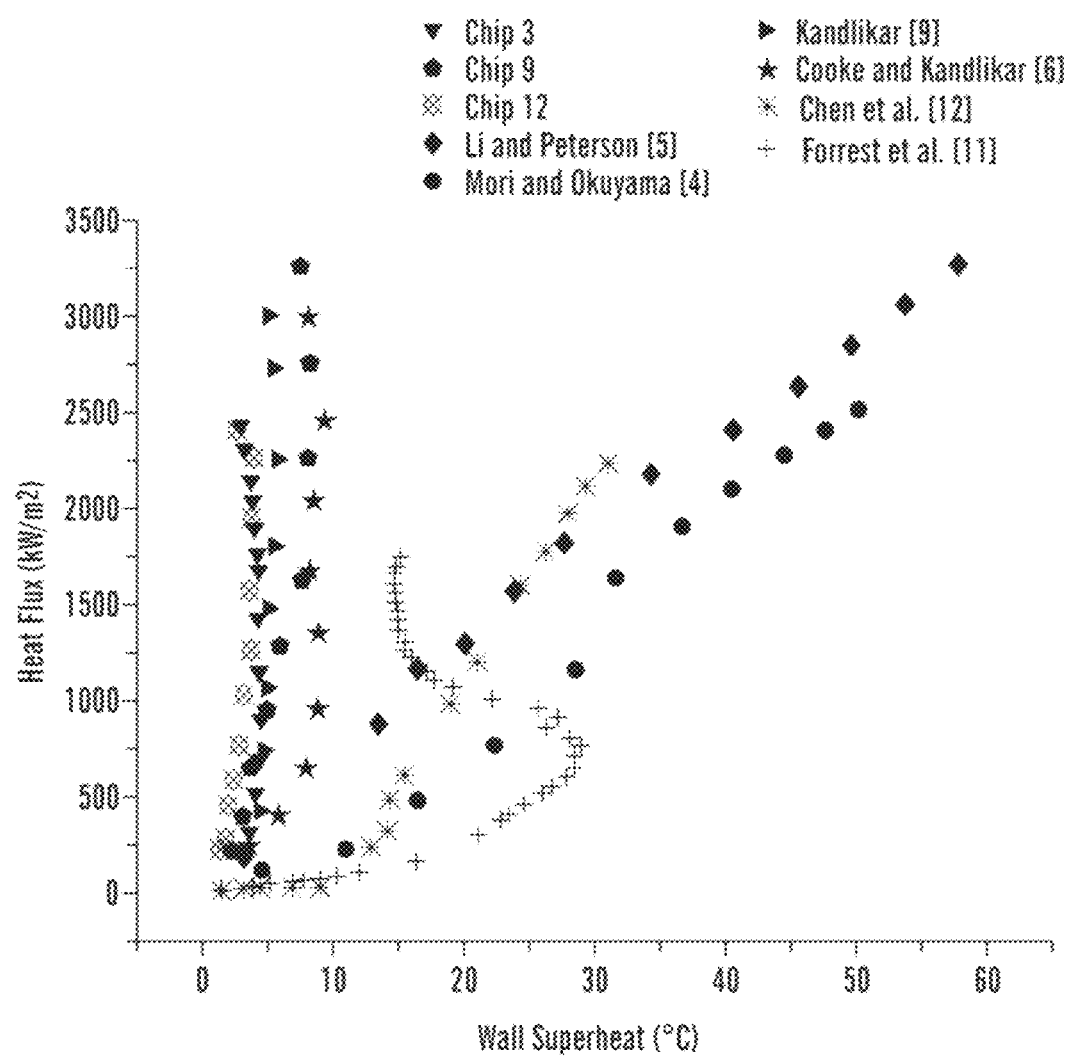
FIG. 12 is a graph of a comparison of pool boiling curves of Chips 3, 9 and 12 with published results.
Figure 13:
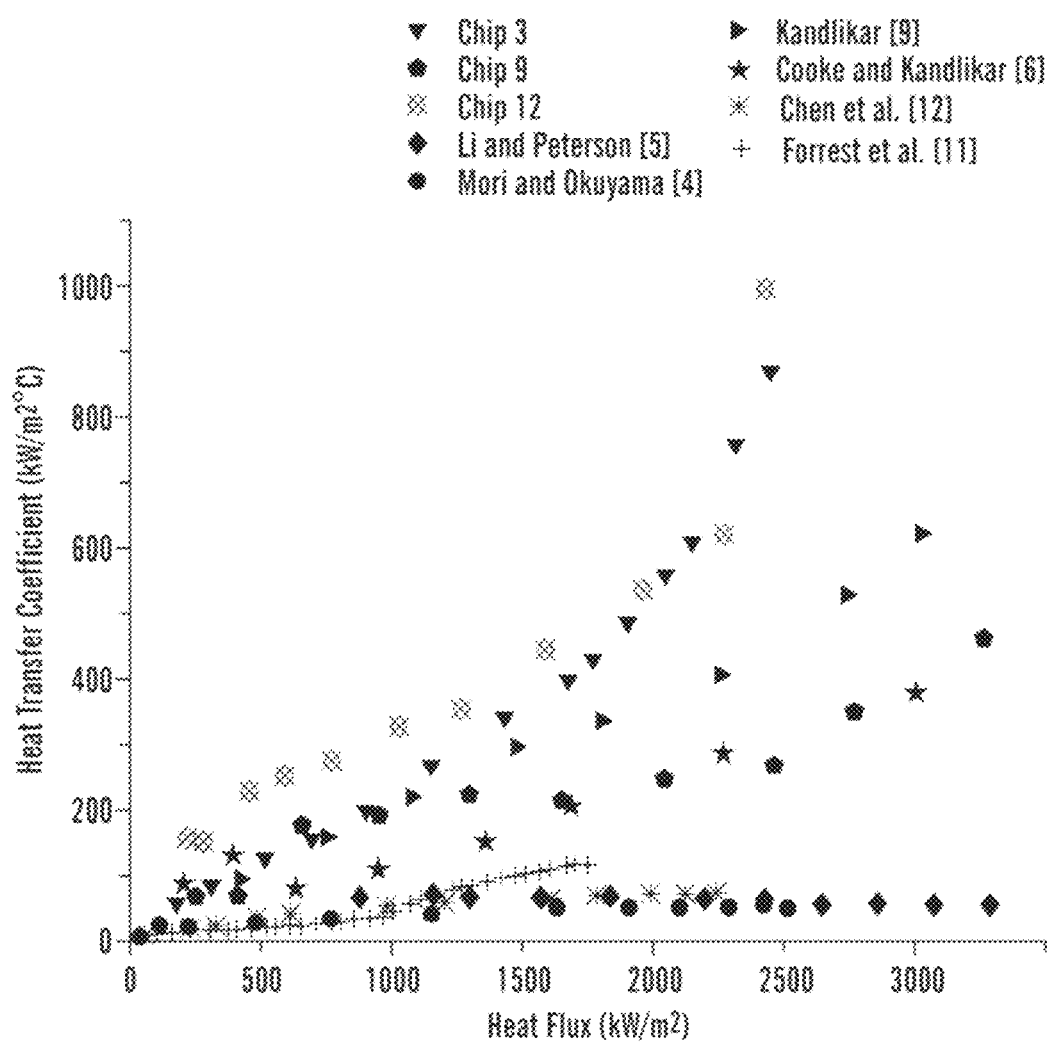
FIG. 13 is a graph of a comparison of heat transfer coefficients of Chips 3 and 12 with published results.
Figure 14:
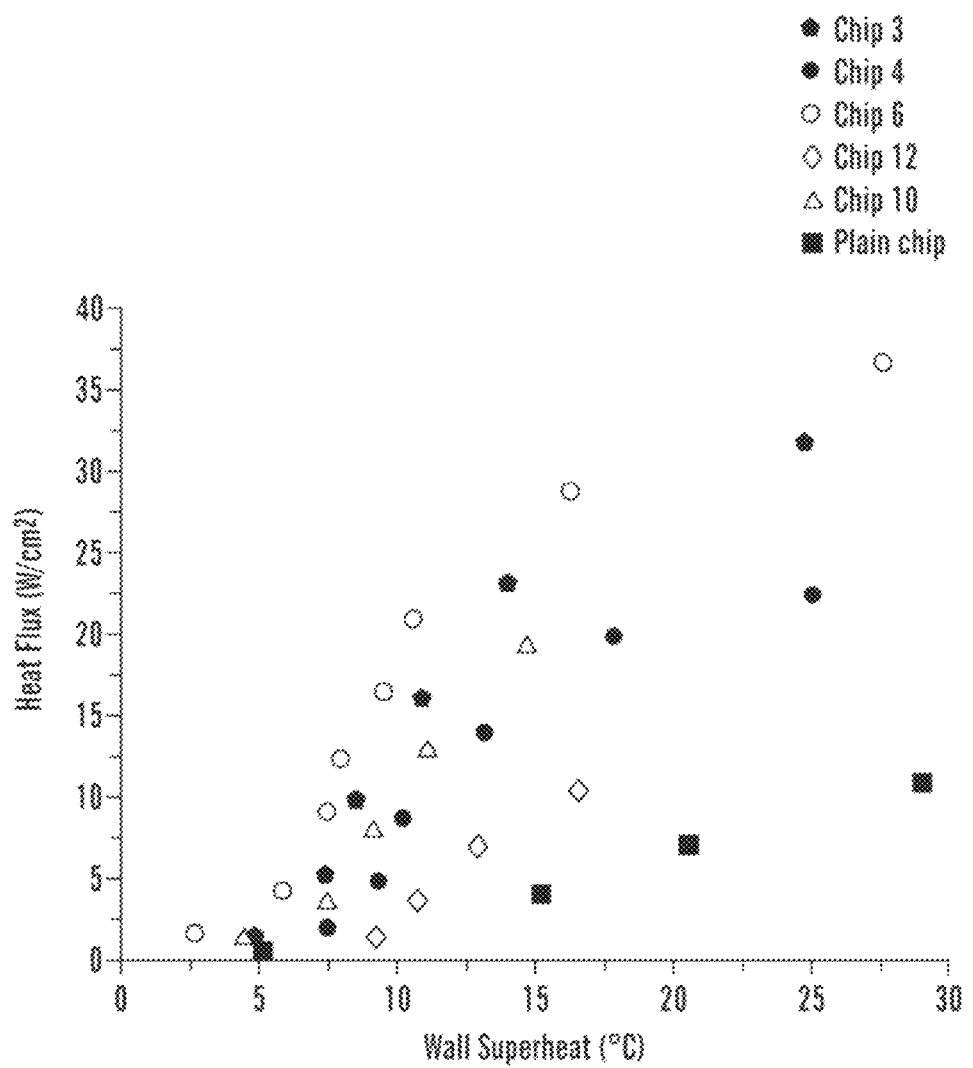
FIG. 14 is a graph of pool boiling results obtained with a chemical liquid (FC-87) used for electronics cooling at atmospheric pressure.
Figure 15:
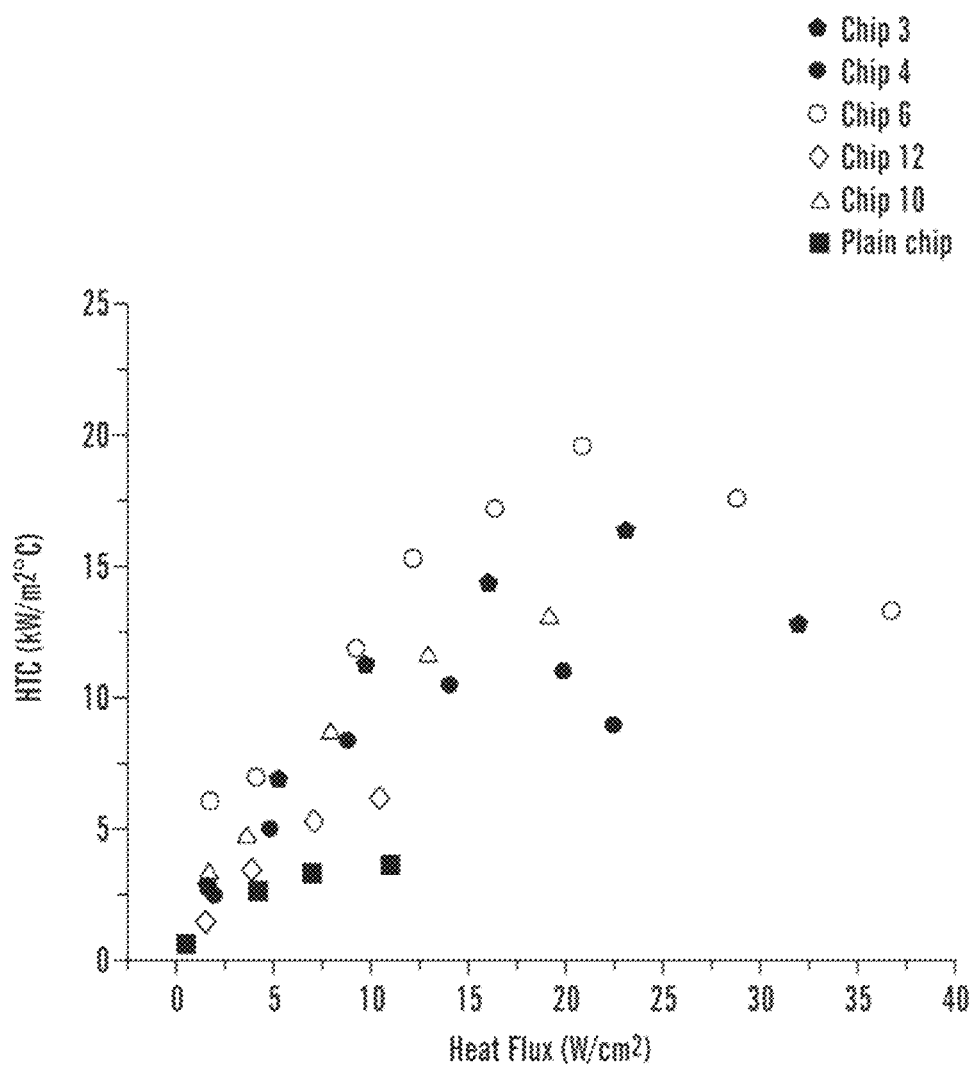
FIG. 15 is a heat transfer coefficient plot for a plain chip and Chips 3, 4, 6, 10, and 12 with a chemical liquid (FC-87) used for electronics cooling at atmospheric pressure.

An enhancement region is applied to boiling of a dielectric fluid Fluorinert-87 on some of the chips in Table 1. FIGS. 12 and 13 shows the pool boiling curves and heat transfer coefficient plots obtained with FC-87. The microchannel dimensions and CHF values are summarized in Table 4. Heat flux is reported in W/cm$^2$ which is the desired units in electronics cooling application. A maximum CHF of 37 W/cm$^2$ is obtained for chip 3. This is the highest CHF obtained with FC-87 when compared to published results in literature. The enhancement in CHF and HTC at CHF were over 100% in CHF and 50% in HTC at CHF. It is seen that Chip 10 performs poorly as compared to the plain chip confirming that some of the configurations, such as wide LNS region and deep microstructures do not produce the desired enhancement effect.

TABLE 4

Test matrix for experimental testing with FC-87

| Chip No. | Channel width (μm) | Channel depth (μm) | Fin width (μm) | CHF (W/cm$^2$) |
|---|---|---|---|---|
| Plain (reference) | — | | | 11 |
| 3 | 300 | 400 | 200 | 31 |
| 4 | 400 | 200 | 200 | 22 |
| 6 | 400 | 400 | 200 | 37 |
| 10 | 762 | 400 | 200 | 10 |
| 12 | 762 | 200 | 200 | 19 |

Although various embodiments have been depicted and described in detail herein, it will be apparent to those skilled in the relevant art that various modifications, additions, substitutions, and the like can be made without departing from the spirit of the disclosure and these are therefore considered to be within the scope of the disclosure as defined in the claims which follow.

What is claimed:

1. A heat transfer system comprising:
a substrate in the system having a heat exchange region comprising a plurality of adjacent open microchannels and having an enhancement region comprising alternating regions of selectively placed plurality of nucleation sites comprising a microporous layer, laser holes, or cavities and regions lacking selectively placed nucleation sites, wherein each adjacent microchannel comprises a bottom surface, an open top and two sidewall surfaces each of which connect the bottom surface and a top surface between the adjacent open microchannels, wherein at least one of the plurality of adjacent open microchannels comprises an enhancement region comprising nucleation sites on the top surface and lacking nucleation sites on the sidewall surfaces and the bottom surface, wherein a width of the region of selectively placed nucleation sites comprises a distance of from about 100 μm to about 4 mm and a width of the region lacking selectively placed nucleation sites comprises a distance of from about 100 μm to about 4 mm, such that bubble formation and departure away from the substrate during boiling of a liquid in contact with the enhancement region induces liquid motion over the surface of the regions lacking selectively placed nucleation sites sufficient to enhance both the critical heat flux and heat transfer coefficient at the critical heat flux in the enhancement region of the system as compared to the heat exchange region surface wherein the enhancement region is replaced by a plain surface.

2. The system of claim 1, wherein the heat exchange region surface is at least one of planar, curved, and an outside surface of a tube.

3. The system of claim 1, wherein the critical heat flux is enhanced at least by about 50 percent and the heat transfer coefficient at critical heat flux is enhanced at least by about 50 percent.

4. The system of claim 1, wherein the critical heat flux is enhanced at least by about 100 percent and the heat transfer coefficient at critical heat flux is enhanced at least by about 50 percent.

5. The system of claim 1, wherein the boiling comprises pool boiling.

6. The system of claim 1, wherein the enhancement region further comprises microstructures comprising a height of from about 0 μm to about 4 mm.

7. The system of claim 6, wherein the microstructures comprise a width of from about 100 μm to about 4 mm.

8. The system of claim 7, wherein a channel gap between the microstructures comprises a width of from about 100 μm to about 4 mm.

* * * * *